United States Patent
Hecke et al.

(10) Patent No.: US 11,975,992 B2
(45) Date of Patent: May 7, 2024

(54) METHOD OF PRODUCING RINSING LIQUID

(71) Applicant: LAM RESEARCH AG, Villach (AT)

(72) Inventors: Angela Hecke, Villach (AT); Hongzhi Wang, Villach (AT); Guenther Zerza, Villach (AT)

(73) Assignee: LAM RESEARCH AG, Villach (AT)

( * ) Notice: Subject to any disclaimer, the term of this patent is extended or adjusted under 35 U.S.C. 154(b) by 575 days.

(21) Appl. No.: 17/040,938

(22) PCT Filed: Mar. 26, 2019

(86) PCT No.: PCT/EP2019/057521
§ 371 (c)(1),
(2) Date: Sep. 23, 2020

(87) PCT Pub. No.: WO2019/185592
PCT Pub. Date: Oct. 3, 2019

(65) Prior Publication Data
US 2021/0017049 A1   Jan. 21, 2021

(30) Foreign Application Priority Data
Mar. 27, 2018 (GB) .................................... 1804881

(51) Int. Cl.
*C02F 1/461* (2023.01)
*B08B 3/04* (2006.01)
(Continued)

(52) U.S. Cl.
CPC ............ *C02F 1/4618* (2013.01); *B08B 3/041* (2013.01); *H01L 21/02057* (2013.01);
(Continued)

(58) Field of Classification Search
CPC .......... C02F 1/4618; C02F 2001/46195; C02F 2103/346; C02F 2201/46115;
(Continued)

(56) References Cited

U.S. PATENT DOCUMENTS 4,326,935 A * 4/1982 Moeglich .................. C25C 7/04
204/520
5,445,722 A   8/1995 Yamaguti et al.
(Continued)

FOREIGN PATENT DOCUMENTS

DE   102016109771 A1   11/2017
GB   2287719 A   9/1995
(Continued)

OTHER PUBLICATIONS

International Search Report and Written Opinion of the ISA issued in PCT/EP2019/057521, dated May 29, 2019; ISA/EP.
(Continued)

*Primary Examiner* — Alexander Markoff

(57) ABSTRACT

The present application discloses a method of producing an aqueous rinsing liquid in an electrochemical cell having an anode chamber with an anode and a cathode chamber with a cathode, the anode chamber and cathode chamber being separated by a cation-selective membrane, wherein the method includes the steps of (a) feeding an aqueous anode chamber feedstock into the anode chamber (b) feeding an aqueous cathode chamber feedstock comprising at least one electrolyte through the cathode chamber; and (c) applying an electrical voltage to the anode and cathode to form rinsing liquid in the cathode chamber; and wherein steps a, b and c are performed, at least in part, simultaneously. Also disclosed is apparatus suitable for carrying out such methods.

16 Claims, 3 Drawing Sheets

(51) Int. Cl.
*H01L 21/02* (2006.01)
*H01L 21/67* (2006.01)
*H01L 21/687* (2006.01)
*C02F 103/34* (2006.01)

(52) U.S. Cl.
CPC .. *H01L 21/67051* (2013.01); *H01L 21/68764* (2013.01); *C02F 2001/46195* (2013.01); *C02F 2103/346* (2013.01); *C02F 2201/46115* (2013.01); *C02F 2201/4618* (2013.01); *C02F 2209/005* (2013.01); *C02F 2209/04* (2013.01); *C02F 2209/06* (2013.01); *C02F 2209/40* (2013.01)

(58) Field of Classification Search
CPC ........ C02F 2201/4618; C02F 2209/005; C02F 2209/04; C02F 2209/06; C02F 2209/40; B08B 3/041; H01L 21/02057; H01L 21/67051; H01L 21/68764
See application file for complete search history.

(56) References Cited

U.S. PATENT DOCUMENTS

| | | | | |
|---|---|---|---|---|
| 5,549,798 | A * | 8/1996 | Kitajima | ............... C02F 1/4618 204/239 |
| 5,676,760 | A * | 10/1997 | Aoki | ...................... B08B 3/102 257/E21.228 |
| 5,824,200 | A * | 10/1998 | Kitajima | ............... C02F 1/4618 257/E21.001 |
| 5,983,909 | A * | 11/1999 | Yeol | .......................... C02F 1/70 134/102.1 |
| 5,993,639 | A | 11/1999 | Miyashita et al. | |
| 6,143,163 | A | 11/2000 | Sawamoto et al. | |
| 6,527,940 | B1 | 3/2003 | Shimamune et al. | |
| 9,090,854 | B2 | 7/2015 | Hoffmann et al. | |
| 2006/0115774 | A1 | 6/2006 | Wang et al. | |
| 2007/0018638 | A1 | 1/2007 | Roth | |
| 2010/0187129 | A1 | 7/2010 | Sano | |
| 2011/0315561 | A1* | 12/2011 | Rabaey | ................... H01M 8/16 210/605 |
| 2013/0092558 | A1 | 4/2013 | Kim et al. | |
| 2014/0231010 | A1 | 8/2014 | Park et al. | |
| 2015/0122668 | A1* | 5/2015 | Karabin | ................ C02F 1/4602 204/263 |
| 2015/0176142 | A1* | 6/2015 | Lambert | ................. C25B 11/02 205/510 |
| 2016/0362310 | A1 | 12/2016 | Fryda et al. | |
| 2017/0191173 | A1* | 7/2017 | Han | .......................... C25B 9/19 |
| 2020/0043766 | A1 | 2/2020 | Rebstock et al. | |

FOREIGN PATENT DOCUMENTS

| | | | |
|---|---|---|---|
| JP | H08144077 | A | 6/1996 |
| JP | H10001794 | A | 1/1998 |
| JP | 2013010988 | A | 1/2013 |
| KR | 20130040492 | A | 4/2013 |
| KR | 20140103650 | A | 8/2014 |
| TW | 260815 | B | 10/1995 |
| TW | 440475 | B | 6/2001 |
| WO | WO 2011070926 | * | 6/2011 |
| WO | WO-2017203007 | A1 | 11/2017 |

OTHER PUBLICATIONS

Office Action issued in corresponding Taiwanese Patent Application 108110236 dated Dec. 2, 2022.

* cited by examiner

METHOD OF PRODUCING RINSING LIQUID

CROSS-REFERENCE TO RELATED APPLICATIONS

This application is a U.S. National Phase Application under 35 U.S.C. 371 of International Application No. PCT/EP2019/057521, filed on Mar. 26, 2019, which claims the benefit of Great Britain Patent Application No. GB 1804881.9, filed on Mar. 27, 2018. The entire disclosures of the applications referenced above are incorporated herein by reference.

FIELD OF THE INVENTION

The present invention relates to a method of producing a rinsing liquid and particularly, although not exclusively, to a method of producing a rinsing liquid in an electrochemical cell for use in the rinsing of a surface of an item to prevent build-up of static energy while avoiding damage to the surface of the item.

BACKGROUND

Semiconductor wafers are processed in the manufacture of integrated circuits, for example, to produce sub-microscopic features on the surface of the wafer. The processing typically involves a number of wet processing stages and the wafers are typically rinsed and dried after such processing. Spinning of the semiconductor wafer typically occurs in the spin-rinse-dry stage of processing.

Deionized water has traditionally been used for the rinsing of semiconductor wafers after processing. High quality deionized water has few impurities and so does not leave any material on the wafer after rinsing. However, deionized water also has very high resistivity (in other words, low conductivity). This results in a significant risk of increasing the static charge on the wafer during rinsing. If that static charge increases to a sufficient level, then an undesirable electrical discharge can occur. Such an electrical discharge can damage the features on the wafer and result in defects in the integrated circuit formed on the wafer.

US 2006/0115774 A1 describes a method for eliminating or reducing the accumulation of electrostatic charges on semiconductor wafers during the spin-rinse-drying of the wafers. This method uses an ionic solution or deionised water with dissolved carbon dioxide during rinsing to neutralise electrostatic charges on the wafer as the wafer rotates. The dissolved carbon dioxide in the deionised water results in increasing the conductivity of the water such that the accumulation of static charges is reduced or prevented.

As an alternative to using carbon dioxide dissolved in deionised water, U.S. Pat. No. 9,090,854 describes the use of a dilute aqueous solution of ammonia or amine as a rinse liquid for the rinsing of the wafer. The rinsing solution has a pH in the region of 8 to 10 and so provides a non-acidic rinsing solution alternative to the acidic deionized water with carbon dioxide rinsing liquid.

More recently, US 2016/0362310 A1 notes that "electrolyzed water" is used for cleaning surfaces, in particular in semiconductor technology. There is described a method for electrochemically producing electrolyzed water. The described method uses an electrochemical cell with an anode chamber separated by an ion exchange membrane from a cathode chamber. Water is passed through the cathode chamber and water including an electrolyte is passed through the anode chamber. When an electrical voltage is applied to the anode and cathode, electrolysed water is formed in the cathode chamber. In particular, the electrolyte, such as the ammonium ion, passes from the anode chamber through the ion-exchange membrane into the cathode chamber to form the electrolysed water.

U.S. Pat. No. 6,143,163 describes a water electrolysis method for producing acidic water and alkaline water which is said to be effective at preventing dissolution of electrode material. The applicant notes that once the power supply to an electrolysis cell is cut off, the anode and cathode each assumes a potential depending on the environment of the anode or cathode chamber, leading to the generation of a reverse current. This reverse current is said to cause reduction of the anode material in the anode chamber, and oxidation of the cathode material and collector of the cathode chamber, leading to metal dissolution and/or electrode deactivation (in this regard, U.S. Pat. No. 6,143,163 uses metal-based electrodes instead of carbon based electrodes—see column 6, lines 18 to 30). To overcome this issue, the applicant proposes applying a voltage and/or electric current between the anode and cathode in a power supply cutoff state, insufficient to cause electrolysis but sufficient to prevent generation of a reverse current. The document indicates that alkaline water can be produced by supplying pure water and/or ammonium hydroxide to the cathode chamber (see column 7, lines 45 to 54).

JPH10-001794 describes an electrolytic cell for producing alkaline water, the cell having an anode chamber and cathode chamber separated by a perfluorocarbon cation exchange membrane, where the cathode compartment is made of a fluororesin, the cathode is made from platinum and/or ruthenium oxide and the cathode collector is made from zirconium. Similarly, to U.S. Pat. No. 6,143,163, the document indicates that alkaline water can be produced by supplying pure water and/or ammonium hydroxide to the cathode chamber.

However, in both U.S. Pat. No. 6,143,163 and JPH 10-001794 the method of introducing the electrolyte ammonium hydroxide is not specified (for example, there is no disclosure of using a cathode chamber feedstock including ammonium hydroxide). Furthermore, no details are given of the component to supply to the anode chamber in the production of alkaline water. In this regard, the specific examples of U.S. Pat. No. 6,143,163, use pure water as the feedstock for both the anode chamber and cathode chamber, and the specific examples of JPH 10-001794 all use pure water as the feedstock for the cathode chamber. In addition, neither document indicates the concentration of ammonium hydroxide (or electrolyte more generally), nor the effect of the ammonium hydroxide.

JPH08-144077, JP 2013/010988, GB2287719, US 2010/0187129, WO 2017/203007, U.S. Pat. No. 6,527,940 and US 2007/018638 also describe methods for electrolysing water.

The present invention has been devised in light of the above considerations.

SUMMARY

At its most general, the present invention provides a method for producing a rinsing liquid in an electrochemical cell by passing water with a dissolved electrolyte through a cathode chamber and applying an electrical voltage to the anode and cathode of the electrochemical cell.

In a first aspect, the present invention provides a method of producing an aqueous rinsing liquid in an electrochemical cell having an anode chamber with an anode and a cathode chamber with a cathode, the anode chamber and cathode chamber being separated by a cation-selective membrane, wherein the method includes the steps of:

a. Feeding an aqueous anode chamber feedstock into the anode chamber;
b. Feeding an aqueous cathode chamber feedstock comprising at least one electrolyte through the cathode chamber; and
c. Applying an electrical voltage to the anode and cathode to form rinsing liquid in the cathode chamber;

And wherein steps a, b and c are performed, at least in part, simultaneously.

The rinsing liquid produced by the method of the first aspect can be used as the rinsing liquid in rinsing of a surface of an item, in particular, the surface of a semiconductor wafer. As will be described in more detail below, the method of the first aspect may allow control of the concentration of the electrolyte in the rinsing liquid while also controlling the oxidation-reduction potential (ORP) of the rinsing liquid. In this way, the conductivity of the rinsing liquid can be maintained at level sufficient to prevent accumulation of static charges but also prevent corrosion of the surface of the rinsed item by control of the ORP of the rinsing liquid. The pH of the electrolysed water may also be independently selected.

The aqueous anode chamber feedstock is the liquid that is fed into anode chamber before and during the electrical voltage is applied to the anode and the cathode. As such, the aqueous anode chamber feedstock may also be referred to as the aqueous anode chamber feed liquid or the aqueous anode chamber inflow.

Similarly, the aqueous cathode chamber feedstock is the liquid that is fed into cathode chamber before and during the electrical voltage is applied to the anode and the cathode. As such, the aqueous cathode chamber feedstock may also be referred to as the aqueous cathode chamber feed liquid or the aqueous cathode chamber inflow.

The anode chamber feedstock and cathode chamber feedstock are typically fed into the anode chamber and cathode chamber, respectively, before step c of applying the electrical voltage is applied. In this way, the anode chamber and cathode chamber may be filled with anode chamber feedstock and cathode chamber feedstock, respectively, before the electrical voltage is applied.

When the electrical voltage is applied to the anode and the cathode in step c, anode chamber feedstock and cathode chamber feedstock entering the anode chamber and cathode chamber, respectively, typically causes a flow of liquid through the cathode and anode chambers. Such a flow of liquid typically allows liquid from the anode and cathode chamber to leave an exit (or outlet) of the anode and cathode chamber, respectively. The outlet of the anode chamber and/or the cathode chamber may be on an upper part of the electrochemical cell. In this way, any gas generated in the anode and cathode chambers may be removed from the electrochemical cell. The build-up of gas in the electrochemical cell may pose a safety hazard, for example, when the gas is hydrogen gas.

Feeding of the anode chamber feedstock and cathode chamber feedstock involves the input of each feedstock into the anode chamber and cathode chamber, respectively. An electrolyte is known to mean a substance that produces an electrically conducting solution when dissolved in a polar solvent, such as water.

In a second aspect, the present invention provides an apparatus for producing an aqueous rinsing liquid, the apparatus comprising electrochemical cell having an anode in an anode chamber and a cathode in a cathode chamber, the anode chamber and the cathode chamber being separated by a cation-selective membrane, wherein the anode chamber includes an anode chamber inlet for receiving an anode chamber feedstock, the cathode chamber includes a cathode chamber feedstock inlet for receiving a cathode chamber feedstock, the aqueous cathode chamber feedstock comprising water and at least one electrolyte, and wherein the apparatus further includes an anode chamber feedstock source in fluid communication with the anode chamber inlet for providing the aqueous anode chamber feedstock to the anode chamber, and a cathode chamber feedstock source in fluid communication with the cathode chamber inlet for providing the aqueous cathode chamber feedstock to the anode chamber.

The anode chamber feedstock source is the anode chamber feedstock supply for providing the anode chamber feedstock to the electrochemical cell. Similarly, the cathode chamber feedstock source is the cathode chamber feedstock supply for providing the cathode chamber feedstock to the electrochemical cell.

In a third aspect, the present invention provides a method of producing an aqueous rinsing liquid in an electrochemical cell having an anode chamber with an anode and a cathode chamber with a cathode, the anode chamber and cathode chamber being separated by a cation-selective membrane, wherein the method includes the steps of:

a. Feeding an aqueous anode chamber feedstock into the anode chamber;
b. Feeding an aqueous cathode chamber feedstock;
c. Applying an electrical voltage to the anode and cathode; wherein steps a., b. and c. are performed, at least in part, simultaneously, and further performing the steps of:
d. Releasing a cathode chamber output liquid from the cathode chamber during and/or after step c. through a cathode chamber outlet; and
e. adding at least one electrolyte to the cathode chamber output liquid to form the aqueous rinsing liquid.

The cathode chamber output liquid is the cathode chamber outflow from the anode chamber.

As such, the cathode chamber output liquid is the product of the cathode chamber feedstock (inflow, feed liquid) after application of the electrical voltage to the anode and cathode.

In a fourth aspect, the present invention provides an apparatus for producing an aqueous rinsing liquid, the apparatus comprising electrochemical cell having an anode in an anode chamber and a cathode in a cathode chamber, the anode chamber and the cathode chamber being separated by a cation-selective membrane, wherein the anode chamber includes an anode chamber inlet for receiving an anode chamber feedstock, the cathode chamber includes a cathode chamber feedstock inlet for receiving a cathode chamber feedstock and the cathode chamber includes a cathode chamber outlet for releasing liquid from the cathode chamber, and wherein the apparatus further includes an anode chamber feedstock source in fluid communication with the anode chamber inlet for providing the aqueous anode chamber feedstock to the anode chamber, an cathode chamber feedstock source in fluid communication with the cathode chamber inlet for providing the aqueous cathode chamber feedstock to the anode chamber, and an electrolyte source to deliver to an electrolyte to the cathode chamber output liquid released from the cathode chamber through the cathode chamber outlet.

The invention includes the combination of the aspects and preferred features described except where such a combination is clearly impermissible or expressly avoided.

SUMMARY OF THE FIGURES

Embodiments illustrating the principles of the invention will now be discussed with reference to the accompanying figures in which.

DETAILED DESCRIPTION OF THE INVENTION

Figure 1:
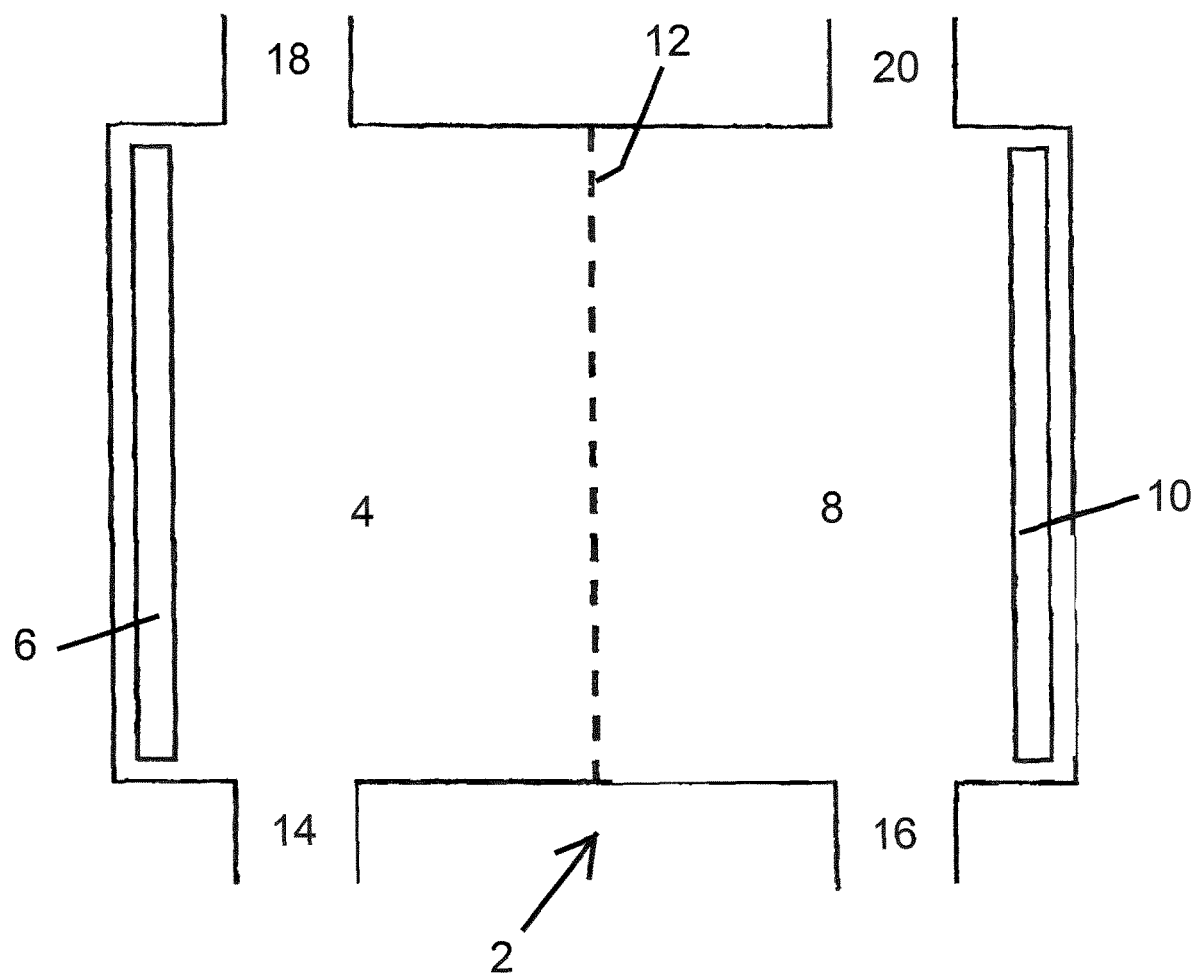
FIG. 1. shows a schematic of an electrochemical cell useful in the present invention.

Aspects and embodiments of the present invention will now be discussed with reference to the accompanying figures. Further aspects and embodiments will be apparent to those skilled in the art. All documents mentioned in this text are incorporated herein by reference.

The method and apparatus of the present invention use an electrochemical cell in order to, in use, produce an aqueous rinsing liquid suitable for rinsing a surface of a semiconductor wafer. The electrochemical cell has an anode chamber and a cathode chamber.

Anode Chamber

The anode chamber typically includes anode chamber walls surrounding an anode chamber cavity containing an anode. In some embodiments, the anode is a diamond electrode. The use of a diamond electrode reduces the risk of metallic contaminants, such as platinum and palladium. The anode may have an active surface area in the range of 50 to 150 $cm^2$. For example, the active anode surface may have dimensions of 140 mm by 100 mm giving an active surface area of 140 $cm^2$. The anode active surface may form the major plane of the anode. The depth of the anode may be in the range of 1 to 5 mm, for example about 2 mm.

The anode chamber typically has an anode chamber inlet. The anode chamber inlet may be an anode chamber feedstock inlet for receiving aqueous anode chamber feedstock from an anode chamber feedstock source.

In a particular embodiment, the aqueous anode chamber feedstock consists essentially of water. In this way, the only cations that may pass through the cation-selective membrane of the electrochemical cell from the anode chamber to the cathode chamber are hydrogen ions. Hydrogen ions may combine with hydroxide ions in the cathode chamber to form water. More generally, using an aqueous anode chamber feedstock consisting essentially of water avoids undesired species from entering the cathode chamber via the anode chamber. This helps to decouple controlling the pH value and controlling the ORP of the rinsing liquid.

In an alternative embodiment, the aqueous anode chamber feedstock may comprise water and one or more electrolytes. In this embodiment, the cation-selective membrane typically will be impermeable to the cations of the electrolyte. In this way, the cations of the electrolyte in the anode chamber may not pass through the cation selective membrane of the electrochemical cell into the cathode chamber. The electrolytic composition of the liquid in the cathode chamber may remain constant.

In particular embodiments, the water of the anode chamber feedstock is deionised or purified water.

The anode chamber inlet is typically in fluid communication with an anode chamber feedstock source for providing the aqueous anode chamber feedstock. The anode chamber feedstock source may be, for example, an anode chamber feedstock tank. The anode chamber feedstock tank, in use, may contain the aqueous anode chamber feedstock. The anode chamber feedstock source typically includes an inert gas inlet in fluid communication with an inert gas source for providing an inert gas to the anode chamber feedstock source. In this way, the anode chamber feedstock may be under an inert atmosphere. For example, the anode chamber source may include an inert gas inlet in fluid communication with a nitrogen gas source.

The pressure at which the anode chamber feedstock is fed into the anode chamber inlet will depend on the desired flow rate of the anode chamber feedstock into the anode chamber inlet. The absolute pressure inlet pressure at the anode chamber inlet may be up to 4 bar. The flow rate of anode chamber feedstock in the anode chamber may be in the range of 0.5 to 10 litres per minute. In some embodiments, the flow rate of anode chamber feedstock in the anode chamber is in the range of 1 to 5 litres per minute. In particular embodiments, the flow rate of anode chamber feedstock in the anode chamber is in the range of 1.0 to 2.0 litres per minute.

In some embodiments, the anode chamber feedstock is mixed in the anode chamber. For example, the anode chamber feedstock may be put into a turbulent flow. The mixing of the anode chamber feedstock in the anode chamber may be produced by the formation of gas bubbles at the anode when the electrical voltage is applied to the anode and electrode. At higher electrical voltages, more electrolysis will occur, creating more bubbles and more mixing.

The anode chamber typically also includes an anode chamber outlet for releasing an anode chamber output liquid from the anode chamber. The anode chamber output liquid released from the anode chamber through the anode chamber outlet may be fed to a waste outlet for disposing of the liquid released from the anode chamber output liquid.

In particular embodiments, the anode chamber output liquid is fed back to the anode chamber feedstock source. The anode chamber output liquid may have essentially the same composition as the anode chamber feedstock. In this way, the anode chamber output liquid can be recycled to be used as the anode chamber feedstock again. Refilling of the anode chamber feedstock in the anode chamber feedstock source may also be minimised to save on resources, such as water. The anode chamber feedstock source may have an anode chamber output liquid inlet in fluid communication with the anode chamber outlet for receiving the anode chamber output liquid.

Gas, such as ozone, may also be released from the anode chamber outlet. The apparatus may also include an anode chamber output exhaust port for exhausting excess gases from the anode chamber outlet. When the anode chamber outlet is in fluid communication with the anode chamber feedstock source, the anode chamber output exhaust port may be positioned at the anode chamber feedstock source. For example, the anode chamber output exhaust port may be an anode chamber feedstock tank exhaust port included in an anode chamber feedstock tank. In particular embodiments, the anode chamber feedstock source includes the anode chamber output exhaust port and the inert gas inlet in fluid communication with an inert gas source. In this way, the inert gas may assist the exhausting of gas released from the anode chamber outlet through the anode chamber output exhaust port.

Cathode Chamber

The cathode chamber typically includes cathode chamber walls surrounding a cathode chamber cavity containing a cathode. In some embodiments, the cathode is a diamond electrode. The use of a diamond electrode reduces the risk of metallic contaminants, such as platinum and palladium. The cathode may have an active surface area in the range of 50 to 150 $cm^2$. For example, the active cathode surface may have dimensions of 140 mm by 100 mm giving an active surface area of 140 $cm^2$. The cathode active surface may form the major plane of the cathode. The depth of the cathode may be in the range of 1 to 5 mm, for example about 2 mm.

The cathode chamber typically has a cathode chamber inlet. The cathode chamber inlet may be a cathode chamber feedstock inlet for receiving aqueous cathode chamber feedstock from a cathode chamber feedstock source. The water of the aqueous cathode chamber feedstock may be deionised or purified water.

The cathode chamber feedstock may include water and one or more electrolytes. In particular embodiments, the cathode chamber feedstock includes water and a sole electrolyte.

The electrolyte may be any electrolyte useful in increasing the conductivity of water. In particular embodiments, the electrolyte is an amine of the formula $NR^1R^2R^3$, where $R^1$, $R^2$ and $R^3$ are independently selected from hydrogen and $C_{1-4}$ alkyl. In one particular embodiment, the electrolyte is ammonia. Aqueous ammonia solutions are also referred to ammonium hydroxide solutions. In some embodiments, the cathode chamber feedstock is an ammonia or ammonium hydroxide solution.

The concentration of electrolyte or electrolytes in the aqueous cathode chamber feedstock may be in the range of 30 micromolar to 3 millimolar. In this way, a relatively dilute electrolyte solution is used. In a particular embodiment, the aqueous cathode chamber feedstock is an ammonia solution with an ammonia concentration in the range of 30 micromolar to 3 millimolar.

Advantageously, using an aqueous cathode chamber feedstock having a relatively dilute ammonia concentration (for example, in the range of 30 micromolar to 3 millimolar) allows a rinsing fluid to be reliably produced having suitable conductivity, pH and (independently) ORP which displays very low corrosivity. In contrast, the present inventors have found that it is difficult to reliably produce a dilute ammonia-containing rinsing fluid in the cathode chamber by feeding ammonia to the anode chamber and relying on diffusion of ammonia through the cation permeable membrane into the cathode chamber, as such a method leads to poorer control of the obtained ammonia concentration and measured ORP. Furthermore, relying on transfer of ammonia from the anode chamber to the cathode chamber necessitates a relatively more concentrated ammonia solution to be supplied to the anode chamber, which can result in corrosion of components (in particular metal parts) increasing the risk of impurities.

In some embodiments, the cathode chamber feedstock has a pH value in the range of 7.5 to 10.5.

The cathode chamber inlet is typically in fluid communication with a cathode chamber feedstock source. The cathode chamber source may be any arrangement that allows delivery of the cathode chamber feedstock to the cathode chamber inlet. For example, the cathode chamber feedstock source may include a cathode chamber feedstock tank for storing the cathode chamber feedstock or a cathode chamber feedstock concentrate.

The cathode chamber feedstock concentrate is a more concentrated version of the cathode chamber feedstock. The cathode chamber feedstock concentrate, when present, is diluted with water to form the cathode chamber feedstock before introduction into the cathode chamber. In these embodiments, the apparatus may include a dilution point between cathode chamber feedstock tank containing the cathode chamber feedstock concentrate and the cathode chamber inlet. The dilution point may be an in-line dilution point. In other words, water is introduced into the flow of cathode chamber feedstock concentrate to form the cathode chamber feedstock. The dilution point may have cathode chamber feedstock concentrate inlet for receiving cathode chamber feedstock concentrate, a dilution inlet for receiving water and a cathode chamber feedstock outlet for the outflow of a mixture of the cathode chamber feedstock concentrate and water. In some embodiments, the apparatus may have more than one dilution point. In other words, a cathode chamber feedstock concentrate may be diluted several times before reaching the desired electrolyte concentration to form the cathode chamber feedstock.

In a specific embodiment, the cathode chamber feedstock source includes a cathode chamber feedstock tank for receiving water and electrolyte raw material to form a cathode chamber feedstock concentrate and a dilution point located along the fluid path between the cathode chamber feedstock tank and the cathode chamber for dilution with water of the cathode chamber feedstock concentrate during its passage from the cathode chamber feedstock tank and the cathode chamber. In this embodiment, the dilution point typically includes a dilution inlet in fluid communication with a water source.

In this specific embodiment, 1 part by volume of electrolyte raw material (such as concentrated ammonia solution) may be fed into the cathode chamber feedstock tank for every 99 to 999 parts by volume of water. The cathode chamber feedstock concentrate may include 1 part by volume of electrolyte raw material for every 100 to 1000 parts by volume of cathode chamber feedstock concentrate. The cathode chamber feedstock concentrate may then be diluted at the dilution point in the range of 1 part by volume of cathode chamber feedstock concentrate to 49 parts by volume of water to 1 part by volume of cathode chamber feedstock concentrate to 499 parts by volume by volume of water. In this way, the cathode chamber feedstock may be formed. The cathode chamber feedstock may include 1 part by volume of cathode chamber feedstock concentrate for every 50 to 500 parts by volume of the cathode chamber feedstock.

In some embodiments, the cathode chamber feedstock source contains headspace including an inert gas atmosphere. For example, the headspace in the cathode chamber feedstock tank may include an inert gas atmosphere. In particular embodiments, nitrogen gas in the inert gas. When present, the inert gas may be introduced through an inert gas inlet of the cathode chamber feedstock source. The cathode chamber feedstock source may also include a cathode chamber feedstock source exhaust port for venting gas in the cathode chamber feedstock source. In this way, pressure within the cathode chamber feedstock source may be controlled.

The pressure at which the cathode chamber feedstock is fed into the cathode chamber inlet will depend on the desired flow rate of the cathode chamber feedstock into the cathode chamber inlet. The absolute pressure inlet pressure at the cathode chamber inlet may be up to 4 bar. The flow rate of cathode chamber feedstock in the cathode chamber may be in the range of 3 to 100 litres per minute. In some embodiments, the flow rate of cathode chamber feedstock in the cathode chamber is in the range of 4 to 60 litres per minute. In particular embodiments, the flow rate of cathode chamber feedstock in the cathode chamber is in the range of 5 to 50 litres per minute.

In some embodiments, the flow rate of the cathode chamber feedstock through the cathode chamber is twice or more the flow rate of the anode chamber feedstock through the anode chamber. In a particular embodiment, the flow rate of the cathode chamber feedstock through the cathode chamber is three times or more the flow rate of the anode chamber feedstock through the anode chamber. The maximum absolute inlet pressure differential pressure between the anode chamber inlet and cathode chamber inlet may be 0.5 bar.

In some embodiments, the method of the present invention includes measuring the conductivity and/or pH of the cathode chamber feedstock before the cathode chamber feedstock enters the cathode chamber. In some embodiments, the apparatus of the present invention includes a conductivity meter and/or a pH meter located between the cathode chamber feedstock source and the cathode chamber inlet for measuring the conductivity and/or pH of the cathode chamber feedstock before the cathode chamber feedstock enters the cathode chamber. In this way, the electrolyte concentration of the cathode chamber feedstock can be monitored before the electrical voltage is applied. In particular embodiments, the conductivity and pH of the cathode chamber feedstock is measured before the cathode chamber feedstock enters the cathode chamber. In this embodiment, the apparatus may include a conductivity meter and a pH meter located between the cathode chamber feedstock source and the cathode chamber inlet.

In the method and apparatus of the third and fourth aspect, respectively, the cathode chamber feedstock may consist essentially of water. In these aspects, the conductivity and/or pH of the rinsing liquid may be measured. In other words, the conductivity and/or pH may be measured after the electrolyte is added to the aqueous cathode chamber output.

Electrochemical Cell

The internal walls of the anode chamber and cathode chamber may be any material that does not interfere with the electrolytic process. In a particular embodiment, the anode chamber walls and the cathode chamber walls are polyvinylidene fluoride (PVDF).

The electrochemical cell includes a cation-selective membrane for allowing cations to pass from the anode chamber to the cathode chamber. Ion-selective membranes are known per se. For example, the cation-selective membrane may be selected from the Nafion® range of membranes (DuPont). In one embodiment, the cation-selective membrane is Nafion® 450.

The electrical voltage applied to the anode and cathode may be up to 48 volts. In some embodiments, the electrical voltage applied to the anode and cathode is in the range of 10 to 30 volts. In particular embodiments, the electrical voltage applied to the anode and the cathode is in the range of 15 to 25 volts. In one embodiment, the electrical voltage applied to the anode and cathode is about 20 volts. In some embodiments, the current across the whole electrochemical cell is about 20 amps.

The apparatus described herein may include an electrical source for providing the electrical current and voltage for the method described herein. The electrical source may be any known electrical source, in particular, any electrical source known to provide electrical current and voltage for electrochemical cells.

In some embodiments, the anode chamber outlet and/or the cathode chamber outlet are located on an upper surface of the electrochemical cell. In this way, any gas generated from the electrolysis when the electrical voltage is applied to the anode and cathode may be vented from the anode chamber and/or the cathode chamber, respectively. In a particular embodiment, the anode chamber outlet and the cathode chamber outlet are located on an upper surface of the electrochemical cell.

In particular embodiments, the electrochemical cell is as described in US 2016/0362310 A1, the contents of which are expressly incorporated herein. For example, an electrochemical cell useful in the method and apparatus of the present invention may be one of the electrochemical cells available from Condias GmbH (Germany). These cells typically use boron doped diamond electrodes on a silicon substrate, commercially available as DIACHEM® electrodes from Condias GmbH.

In the methods of the present invention, the electrochemical cell may be part of apparatus including:
 a pH meter, for measuring the pH of the aqueous cathode chamber feedstock,
 an ORP sensor, for measuring the ORP of the rinsing liquid, and
 liquid flow meters to control the flow rate of aqueous cathode chamber feedstock and aqueous anode chamber feedstock,
 a controller in communication with the pH meter, ORP sensor and liquid flow meters,
 wherein the controller adjusts the flow rate through the liquid flow meters and/or other parameters (for example, applied voltage, current and/or pulsing) of the apparatus in response to data from the pH meter and/or ORP sensor. Advantageously, this type of apparatus allows separate, dynamic control of pH and ORP.

Aqueous Cathode Chamber Output

The cathode chamber typically includes a cathode chamber outlet. The liquid in the cathode chamber typically passes from the cathode chamber inlet (as cathode chamber feedstock) in the vicinity of the cathode or cathodes to the cathode chamber outlet. The liquid passing out of the cathode chamber outlet is the aqueous cathode chamber output. Where the cathode chamber feedstock includes an electrolyte, the aqueous cathode chamber output forms the rinsing liquid.

In particular embodiments, the oxidation-reduction potential (ORP) of the aqueous cathode chamber output is 0 mV or negative. In other words, the aqueous cathode chamber output may be neutral or reducing. In this way, the aqueous cathode chamber output may not corrode the semiconductor wafer.

In particular embodiments, the ORP of the aqueous cathode chamber output is −500 mV or more negative. In more particular embodiments, the ORP of the aqueous cathode chamber output is −550 mV or more negative. In certain embodiments, the ORP of the aqueous cathode chamber output is in the range of −550 to −900 mV.

In some embodiments, the method of the present invention includes the step of measuring the ORP of the cathode chamber output. In these embodiments, the apparatus may include an ORP sensor for measuring the ORP of the cathode chamber output. Measuring the ORP of the cathode chamber output liquid provides a check that the cathode chamber output is suitable to become the rinsing liquid, for example, for a semiconductor wafer. ORP sensors are known per se. ORP sensors are electrochemical sensors and typically is a sensor including a measuring electrode and a reference electrode. The measuring electrode is typically a noble metal electrode, such as a platinum electrode or gold electrode.

Typically, a sample or aliquot of the cathode chamber output is taken from the cathode chamber output to measure the ORP. The sample may be discarded as waste after measuring of the ORP by the ORP sensor. Measuring of the cathode chamber output by the ORP sensor may contaminate the cathode chamber output making the tested sample of cathode chamber output unsuitable for returning to the bulk cathode chamber output. The ORP sensor may be arranged on a branch line of the apparatus positioned after the cathode chamber outlet. In other words, a separate ORP sensor channel may branch from a main cathode chamber output channel for channelling a sample of the cathode chamber output.

The rinsing liquid is formed when the aqueous cathode chamber output leaves the cathode chamber where the cathode chamber feedstock includes an electrolyte. In other words, the rinsing liquid is formed when the aqueous cathode chamber output leaves the cathode chamber in the first and second aspects. The rinsing liquid is formed when the aqueous cathode chamber output is combined with the electrolyte in the third and fourth aspects.

In a particular embodiment, the rinsing liquid is used to rinse a semiconductor wafer. In some embodiments, the rinsing liquid has a conductivity of 10 μS/cm or more.

The rinsing liquid may be used directly from the cathode chamber or may be stored in a rinsing liquid storage tank.

In particular embodiments, the apparatus includes a rinsing liquid storage tank in fluid communication with the cathode chamber outlet for storing of the rinsing liquid. In particular embodiments, the headspace of the rinsing liquid storage tank includes an inert gas atmosphere. For example, the headspace of the rinsing liquid storage tank includes a nitrogen gas atmosphere. When present, the inert gas may be introduced through an inert gas inlet of the rinsing liquid storage tank. The rinsing liquid storage tank may also include a rinsing liquid storage tank exhaust port for venting gas in the rinsing liquid storage tank. In this way, pressure within the rinsing liquid storage tank may be controlled and, in particular, any hydrogen gas generated in the cathode chamber may be vented.

In particular embodiments, the rinsing liquid is stored in a rinsing liquid storage tank with a rinsing liquid storage tank exhaust port before using as a rinsing liquid to rinse a semiconductor wafer. The rinsing liquid may be stored in the rinsing liquid storage tank for up to two hours before using as a rinsing liquid to rinse a semiconductor wafer.

In some embodiments, the method includes a further step of rinsing a semiconductor wafer with the rinsing liquid. In particular embodiments, the semiconductor wafer is spinning during the step of rinsing with the rinsing liquid. The step of rinsing may be performed in a wafer rinsing chamber. The wafer rinsing chamber may form part of the apparatus described herein. In some embodiments, the apparatus of the present invention may include a plurality of wafer rinsing chambers and each wafer rinsing chamber may be supplied with rinsing liquid from the electrochemical cell.

The wafer rinsing chamber may be in fluid communication with the rinsing liquid storage tank or directly in fluid connection with the cathode chamber outlet through a wafer rinsing chamber pipe. When the wafer rinsing chamber is in direct fluid connection with the cathode chamber outlet, the wafer rinsing chamber pipe will typically include a gas exhaust port to vent any excess gas, such as hydrogen gas, present in the rinsing liquid.

Where any part of the apparatus of the present invention is in fluid communication with another part of the apparatus, any suitable connection may be used. For example, suitable pipes and conduits are known, per se.

FIG. 1 shows a schematic of an electrochemical cell 2 useful in the present invention. The electrochemical cell is divided into an anode chamber 4 containing an anode 6 and a cathode chamber 8 containing a cathode 10. The anode chamber 4 and the cathode chamber 8 are separated by a cation-exchange membrane 12.

In use, an anode chamber feedstock of deionised water is fed into the anode chamber 4 through an anode chamber feedstock inlet 14. At the same time, a cathode chamber feedstock of dilute ammonia solution is fed into the cathode chamber 8 through a cathode chamber feedstock inlet 16. When the anode chamber feedstock and the cathode chamber feedstock are in the electrochemical cell, an electrical voltage of 10 to 12 volts is applied across the anode 6 and the cathode 10. The voltage catalyses the electrochemical reactions and may reduce the oxidation-reduction potential of the dilute ammonia solution in the cathode chamber 8.

Anodic chamber reaction:

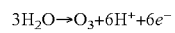

$$3H_2O \rightarrow O_3 + 6H^+ + 6e^-$$

Cathodic chamber reaction:

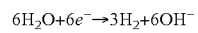

$$6H_2O + 6e^- \rightarrow 3H_2 + 6OH^-$$

The hydrogen ions generated in the anode chamber 4 migrate across the cation exchange membrane 12 to combine with the hydroxide ions generated in the cathode chamber 8 to form water molecules. The anode chamber 4 produces water and ozone and is released from the anode chamber 4 through an anode chamber outlet 18.

Insignificant amounts or no ammonium ions in the cathode chamber 8 migrate across the cation exchange membrane 12. The combination in the cathode chamber 8 of hydrogen ions from the anode chamber 4 and hydroxide ions from the cathode chamber 8 may result in the generation of water molecules in the cathode chamber to replace water molecules used in the cathodic chamber reaction. As such, the cathode chamber 8 may produce an electrolysed water with a similar or substantially similar ammonia concentration as the cathode chamber feedstock while lowering the oxidation-reduction potential below a threshold level. This allows the generation of an electrolysed water useful as a rinsing water because the conductivity of the rinsing liquid is controlled and the damaging corrosion effects are reduced. The electrolysed water is released through a cathode chamber outlet 20.

Using a dilute ammonia solution as the cathode chamber feedstock, deionised water as the anode chamber feedstock, and a cation permeable membrane within the electrochemical cell allows a rinsing fluid to be produced with a well-controlled (low) concentration of ammonia, conductivity, pH and ORP. The ability to control the ammonia concentration at a low level helps to minimise/avoid damage (corrosion) to the surface of an item being treated. In addition, the use of deionised water in the anode chamber feedstock helps to minimise the introduction of unwanted species (for example, impurities) into the cathode chamber across the cation permeable membrane, which might otherwise affect performance. In contrast, as noted above, supplying an ammonia solution to the anode chamber and relying on transfer of ammonia into the cathode chamber through the cation permeable membrane to give a dilute ammonia solution was found not to give reliable results, due to fluctuations in the ammonia concentration, and necessitates the supply of relatively higher concentrations of ammonia solution to the electrochemical cell.

Figure 2:
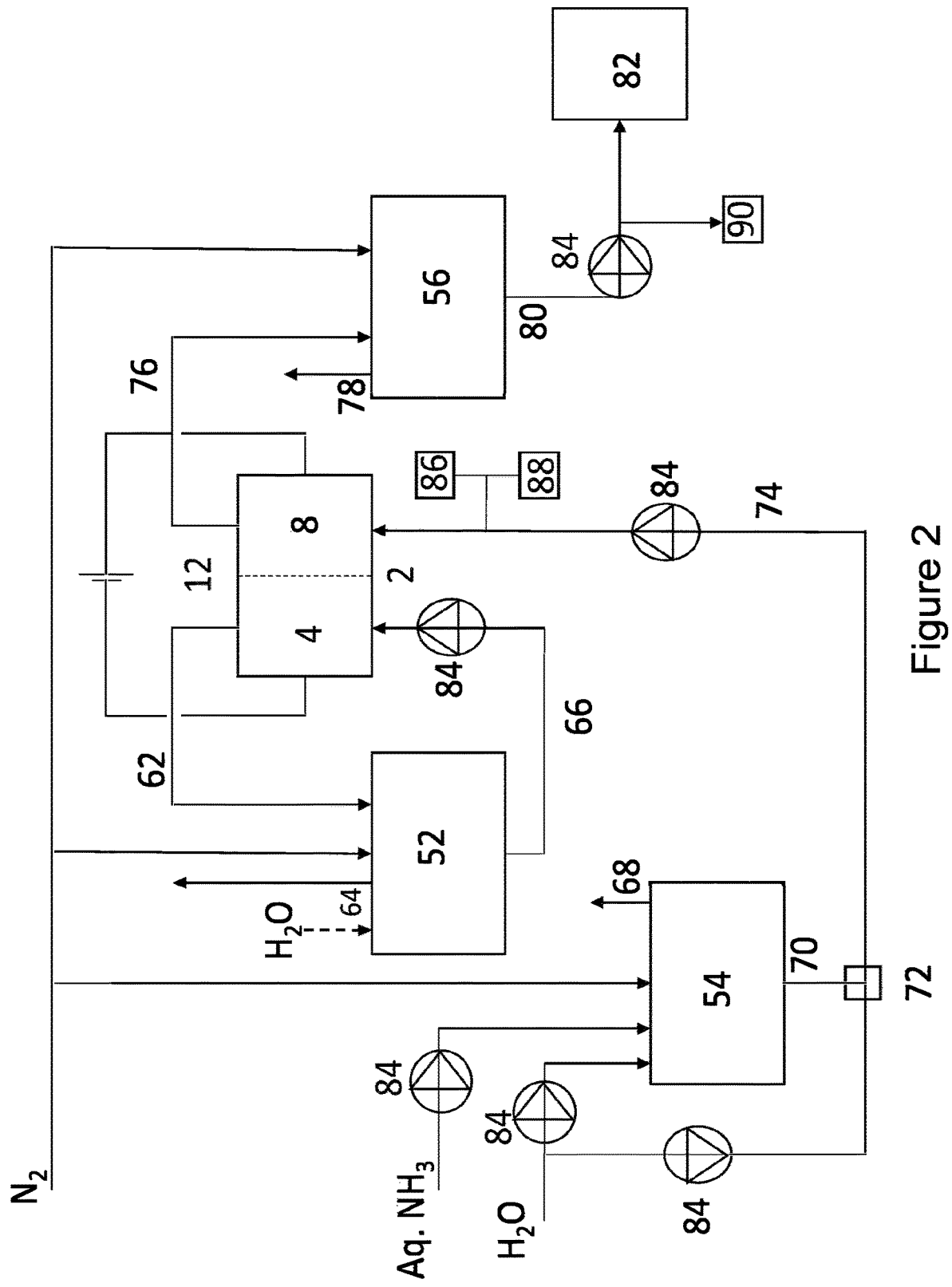
FIG. 2. shows a schematic of an example of the apparatus for producing rinsing liquid according to the first and second aspects of the present invention.

FIG. 2 shows a schematic of an embodiment of the apparatus of the second aspect of the present invention. The apparatus includes the electrochemical cell 2 of FIG. 1, an anode chamber feedstock tank 52, a cathode chamber feedstock tank 54 and a rinsing liquid storage tank 56.

The anode chamber feedstock tank 52 contains deionised water as the anode chamber feedstock. The anode chamber feedstock tank 52 is initially filled with deionised water from a deionised water source. However, the anode chamber feedstock tank 52 is also filled (when the apparatus is in use) by the water and ozone generated from the anode chamber 4. The ozone and water is released through an anode chamber outlet through the anode chamber outlet pipe 62 to the anode chamber feedstock tank 52. The ozone gas is released through an anode chamber feedstock tank exhaust port 64 in the anode chamber feedstock tank 52. Nitrogen gas is also introduced to the anode chamber feedstock tank 52.

When in operation, the deionised water anode chamber feedstock in the anode chamber feedstock tank 52 is fed into the anode chamber feedstock inlet of the anode chamber 4 through the anode chamber feedstock pipe 66.

The cathode chamber feedstock tank 54 contains an ammonia solution as the cathode chamber feedstock concentrate. The cathode chamber feedstock concentrate is formed in the cathode chamber feedstock tank 54 by dilution of approximately 15 molar ammonia solution and deionised water. The 15 molar ammonia solution raw material is diluted between 100 and 1000 times. As such, the cathode chamber feedstock concentrate has a concentration in the range of 15 to 150 millimolar. In this embodiment, nitrogen gas is also added to the cathode chamber feedstock tank 54. A cathode chamber feedstock tank exhaust port 68 is present in the cathode chamber feedstock tank 54. In this way, the pressure in the cathode chamber feedstock tank 54 can be controlled.

The cathode chamber feedstock concentrate leaves the cathode chamber feedstock tank 54 through a cathode chamber feedstock tank outlet 70. The cathode chamber feedstock concentrate is then diluted a second time with deionised water in a T-fitting 72. The cathode chamber feedstock concentrate is diluted in the range of 50 to 500 times. The second dilution provides the cathode chamber feedstock. The cathode chamber feedstock has a concentration of ammonia in the range of 30 micromolar to 3 millimolar. The cathode chamber feedstock is fed to the cathode chamber feedstock inlet in the cathode chamber through a cathode chamber feedstock pipe 74.

When in operation, an electrical voltage of around 10 to 12 volts is applied across the electrochemical cell 2 of the apparatus of FIG. 2. As discussed above, ozone and water is released from the anode chamber outlet and recycled to the anode chamber feedstock tank 52 through the anode chamber outlet pipe 62.

An electrolysed dilute ammonia solution as the rinsing liquid is released from the cathode chamber outlet into the rinsing liquid storage tank 56 through a rinsing liquid pipe 76. As with the cathode chamber feedstock tank 54, nitrogen gas is also added to the rinsing liquid storage tank 56. A rinsing liquid storage tank exhaust port 78 is present in the electrolysed water tank 56. In this way, the pressure in the rinsing liquid tank 56 can be controlled.

The rinsing liquid storage tank has a rinsing liquid tank outlet 80 to feed the rinsing liquid to a one or more wafer rinsing chambers 82 in order for the rinsing liquid to be used as a rinsing liquid to rinse one or more spinning semiconductor wafers.

Various pumps 84 assist with the flow of liquids around the apparatus. In addition, a number of quality control points are present in the apparatus. Some of the cathode chamber feedstock is diverted to a conductivity meter 86 and a pH meter 88 instead of entering the cathode chamber. The conductivity and the pH of the cathode chamber feedstock is measured and dilution of the ammonia raw material and/or the cathode chamber feedstock concentrate is adjusted if needed. This can be automatically controlled by a controller. In addition, an ORP sensor 90 is positioned between the rinsing liquid storage tank 56 and the wafer rinsing chamber 82. In this way, the ORP of the rinsing liquid may be monitored in order to ensure that the ORP is within acceptable limits. This can also be controlled by a controller.

Figure 3:
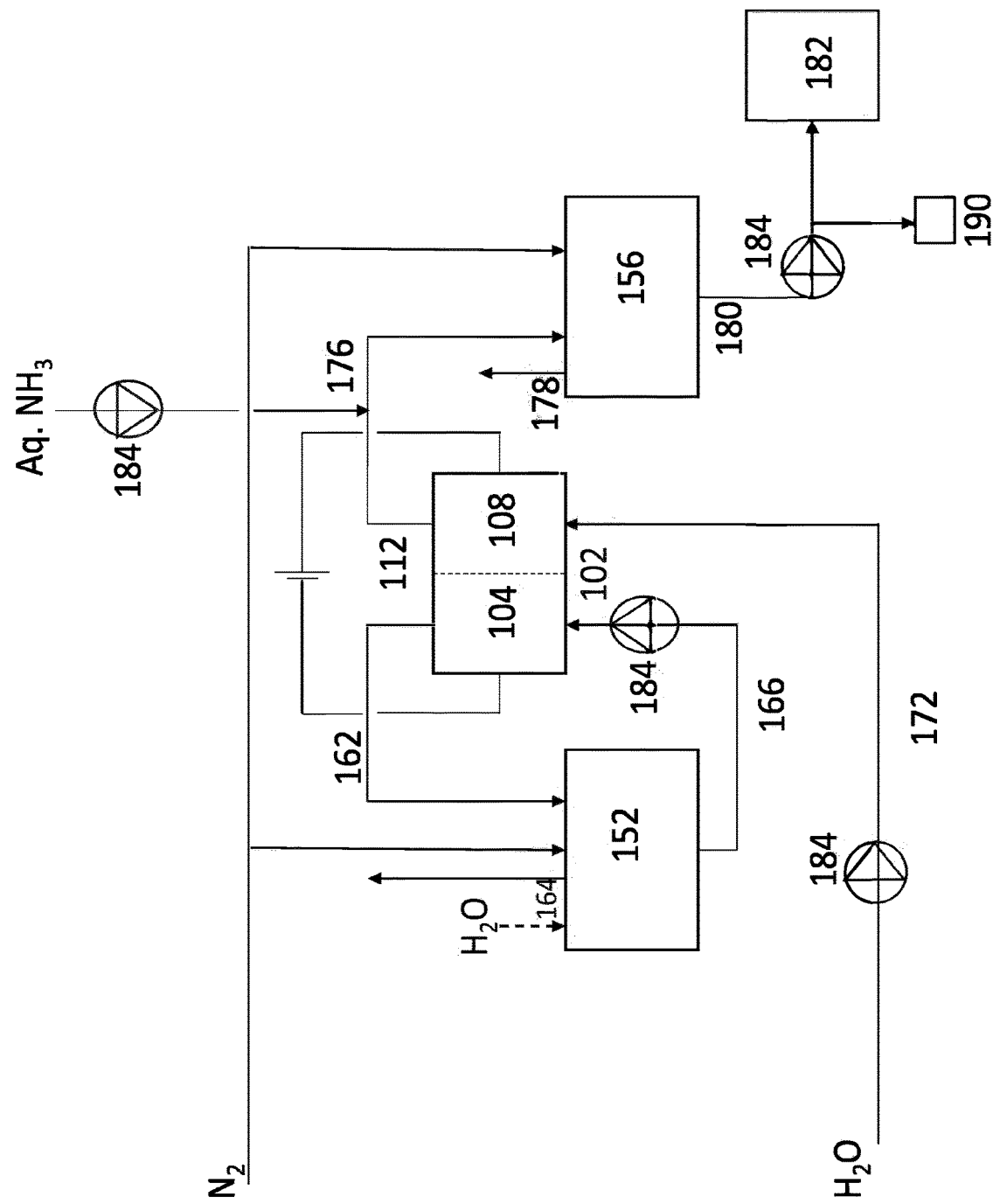
FIG. 3. shows a schematic of an example of the apparatus for producing rinsing liquid according to the third and fourth aspects of the present invention.

FIG. 3 shows an example of the alternative arrangement of the third and fourth aspects of the present invention. The arrangement is broadly the same as the arrangement of FIG. 2. The electrochemical cell 102, anode chamber 104, cathode chamber 108, cation exchange membrane 112, anode chamber feedstock tank 152, rinsing liquid storage tank 156, anode chamber outlet pipe 162, anode chamber feedstock tank exhaust port 164, anode chamber feedstock pipe 166, rinsing liquid pipe 176, rinsing liquid storage tank exhaust port 178, rinsing liquid tank outlet 180, wafer rinsing chambers 182, pumps 184, and ORP sensor 190 are all arranged similarly. However, the cathode chamber feedstock pipe 174 is now connected to a deionised water only cathode chamber feedstock source. The 15 molar ammonia solution raw material as the electrolyte is now added to the rinsing liquid pipe 176 after the cathode chamber outlet. In this way, ammonia electrolyte is added to form the rinsing liquid. The 15 molar ammonia solution raw material is added at a flow rate to provide a concentration of ammonia in the rinsing liquid in the range of 30 micromolar to 3 millimolar.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

REFERENCES

A number of publications are cited above in order to more fully describe and disclose the invention and the state of the art to which the invention pertains. Full citations for these references are provided below. The entirety of each of these references is incorporated herein.
US 2006/0115774 A1
U.S. Pat. No. 9,090,854
US 2016/0362310 A1
U.S. Pat. No. 6,143,163
JPH10-001794
JPH08-144077
JP 2013/010988
GB2287719
US 2010/0187129
WO 2017/203007
U.S. Pat. No. 6,527,940
US 2007/018638

The invention claimed is:

1. A method of producing an aqueous rinsing liquid in an electrochemical cell of an apparatus, the electrochemical cell having an anode chamber with an anode and a cathode chamber with a cathode, the anode chamber and cathode chamber being separated by a cation-selective membrane, wherein the method comprises:
  a. initially filling an anode chamber feedstock tank with only water;
  b. feeding from the anode chamber feedstock tank into the anode chamber an aqueous anode chamber feedstock, the aqueous anode chamber feedstock initially being the water in the anode chamber feedstock tank;
  b. feeding into the cathode chamber an aqueous cathode chamber feedstock consisting of an aqueous solution of ammonia as the sole cathode chamber feedstock; and
  c. applying an electrical voltage to the anode and cathode to form rinsing liquid in the cathode chamber,
  wherein a, b and c are performed, at least in part, simultaneously, and wherein an anode chamber output liquid that is the water and ozone gas resulting from c. either i) is fed from the anode chamber to a waste outlet, or ii) is recycled as anode chamber feedstock such that the anode chamber feedstock tank is also filled with the water and the ozone gas generated from the anode chamber.

2. The method according to claim 1, wherein the aqueous cathode chamber feedstock has a pH value in a range of 7.5 to 10.5.

3. The method according to claim 1, wherein a total electrolyte concentration in the aqueous cathode chamber feedstock is in a range of 30 micromolar to 3 millimolar.

4. The method according to claim 1, wherein a flow rate of the aqueous anode chamber feedstock in the anode chamber is in a range of 0.5 to 10 litres per minute.

5. The method according to claim 1, wherein a flow rate of cathode chamber feedstock in the cathode chamber is in a range of 3 to 100 litres per minute.

6. The method according to claim 1, wherein an oxidation-reduction potential of electrolysed water in the cathode chamber is −550 mV or more negative.

7. The method according to claim 1 further comprising rinsing a spinning semiconductor wafer with the aqueous rinsing liquid from the cathode chamber generated in c.

8. The method according to claim 1, wherein the apparatus comprises the electrochemical cell and further comprises:
  a. a pH meter configured to measure the pH of the aqueous cathode chamber feedstock,
  b. an oxidation-reduction potential (ORP) sensor configured to measure the ORP of the aqueous rinsing liquid,
  c. first and second liquid flow meters configured to control a flow rate of the aqueous cathode chamber feedstock and the aqueous anode chamber feedstock, respectively, and
  d. a controller in communication with the pH meter, the ORP sensor and the first and second liquid flow meters,
  wherein, in response to data from at least one of the pH meter and the ORP sensor, the controller is configured to at least one of:
    adjust a flow rate through the first and second liquid flow meters; and
    adjust other parameters of the apparatus.

9. An apparatus for producing an aqueous rinsing liquid, the apparatus comprising:
  an electrochemical cell having an anode in an anode chamber and a cathode in a cathode chamber and having an electrical voltage across the anode and cathode, wherein:
    the anode chamber and the cathode chamber are separated by a cation-selective membrane,
    the anode chamber includes an anode chamber inlet configured to receive an aqueous anode chamber feedstock and an anode chamber outlet configured to output an anode chamber output liquid that is water and ozone gas generated in the anode chamber, wherein the aqueous anode chamber feedstock is initially only water,
    the cathode chamber includes a cathode chamber feedstock inlet configured to receive an aqueous cathode chamber feedstock, and
    the aqueous cathode chamber feedstock consists of an aqueous solution of ammonia;
  an anode chamber feedstock source in fluid communication with the anode chamber inlet via a first pipe and configured to initially be filled with only water, provide the aqueous anode chamber feedstock to the anode chamber via the first pipe,
  wherein, during application of the electrical voltage, either i) the anode chamber output liquid is fed from the anode chamber outlet to a waste outlet, or ii) the anode chamber output liquid is recycled as anode chamber feedstock from the anode chamber outlet to the anode chamber feedstock source via a second pipe; and
  a cathode chamber feedstock source in fluid communication with the cathode chamber feedstock inlet configured to provide the aqueous cathode chamber feedstock to the cathode chamber.

10. The apparatus according to claim 9 further comprising a wafer rinsing chamber in fluid communication with a cathode chamber outlet of the cathode chamber and configured to receive rinsing liquid generated in the cathode chamber and to rinse a semiconductor wafer with the rinsing liquid.

11. The apparatus according to claim 10 further comprising a rinsing liquid storage tank in fluid communication with the cathode chamber outlet and configured to store the rinsing liquid.

12. The apparatus according to claim 11 wherein the rinsing liquid storage tank includes a rinsing liquid storage tank exhaust port configured to exhaust excess gas.

13. The apparatus according to claim 9 wherein the cathode chamber feedstock source stores a cathode chamber feedstock concentrate and the apparatus includes a dilution point between the cathode chamber feedstock source and a cathode chamber inlet configured to dilute the cathode chamber feedstock concentrate with water before entering the cathode chamber.

14. The apparatus according to claim 9, further comprising:
a pH meter configured to measure a pH of the aqueous cathode chamber feedstock;
an oxidation-reduction potential (ORP) sensor configured to measure an ORP of the aqueous rinsing liquid;
first and second liquid flow meters configured to control a flow rate of the aqueous cathode chamber feedstock and the aqueous anode chamber feedstock, respectively; and
a controller in communication with the pH meter, the ORP sensor and the first and second liquid flow meters, wherein, in response to data from at least one of the pH meter and the ORP sensor, the controller is configured to at least one of adjust a flow rate through the first and second liquid flow meters and adjust other parameters of the apparatus.

15. The method of claim 1, wherein the ozone gas is released from the anode chamber feedstock tank via an exhaust port of the anode chamber feedstock tank.

16. The apparatus of claim 9, wherein:
the anode chamber feedstock source comprises an exhaust port; and
the exhaust port releases the ozone gas from the anode chamber feedstock source.

* * * * *